(12) United States Patent
Hauser

(10) Patent No.: US 7,535,245 B2
(45) Date of Patent: May 19, 2009

(54) INTEGRATED CIRCUIT WITH INTEGRATED CIRCUIT SECTION TO AID IN TESTING

(75) Inventor: Clemens Hauser, Heilbronn (DE)

(73) Assignee: Atmel Germany GmbH, Heilbronn (DE)

( * ) Notice: Subject to any disclaimer, the term of this patent is extended or adjusted under 35 U.S.C. 154(b) by 0 days.

(21) Appl. No.: 11/586,710

(22) Filed: Oct. 26, 2006

(65) Prior Publication Data
US 2007/0096960 A1 May 3, 2007

(30) Foreign Application Priority Data
Oct. 27, 2005 (DE) .................. 10 2005 052 269

(51) Int. Cl.
*G01R 31/26* (2006.01)
(52) U.S. Cl. .................................. 324/765
(58) Field of Classification Search .......... 324/760, 324/763, 765, 158.1, 769, 768; 257/48; 438/14–18; 714/733, 724
See application file for complete search history.

(56) References Cited
U.S. PATENT DOCUMENTS

| 5,132,937 A | 7/1992 | Tuda et al. |
| 5,600,271 A | 2/1997 | Erickson et al. |
| 6,239,603 B1 * | 5/2001 | Ukei et al. .................. 324/763 |
| 6,356,105 B1 | 3/2002 | Volk |
| 6,624,656 B1 | 9/2003 | Fox et al. |
| 6,727,721 B2 | 4/2004 | Altrichter et al. |
| 6,937,006 B2 * | 8/2005 | West ...................... 324/158.1 |
| 6,937,048 B2 | 8/2005 | Eichin et al. |
| 2003/0160620 A1 | 8/2003 | Miesterfeld |

FOREIGN PATENT DOCUMENTS

| DE | 100 64 478 A1 | 7/2002 |
| DE | 101 34 215 A1 | 1/2003 |

OTHER PUBLICATIONS

U. Tietze et al., "Halbleiter-Schaltungstechnik," 8th revised edition, Publishing House Springer Berlin, Heidelberg, New York, London, Paris, Tokyo, 1986, pp. 83-97 and 166-189; ISBN 3-540-16720-X.

* cited by examiner

*Primary Examiner*—Jermele M Hollington
*Assistant Examiner*—Tung X Nguyen
(74) *Attorney, Agent, or Firm*—Muncy, Geissler, Olds & Lowe, PLLC

(57) ABSTRACT

An integrated circuit is disclosed having at least one digital input, which has a first circuit section that has a current-voltage characteristic and that in the absence of an input signal holds a voltage at the input at a defined value, and having a second circuit section that provides a signal that is internal to the circuit and whose state does not directly show itself at an output of the circuit. The first circuit section has a control input for a control signal and is designed to change its current-voltage characteristic when the control signal is present at the control input. In addition, a method for testing such a circuit is disclosed.

7 Claims, 2 Drawing Sheets

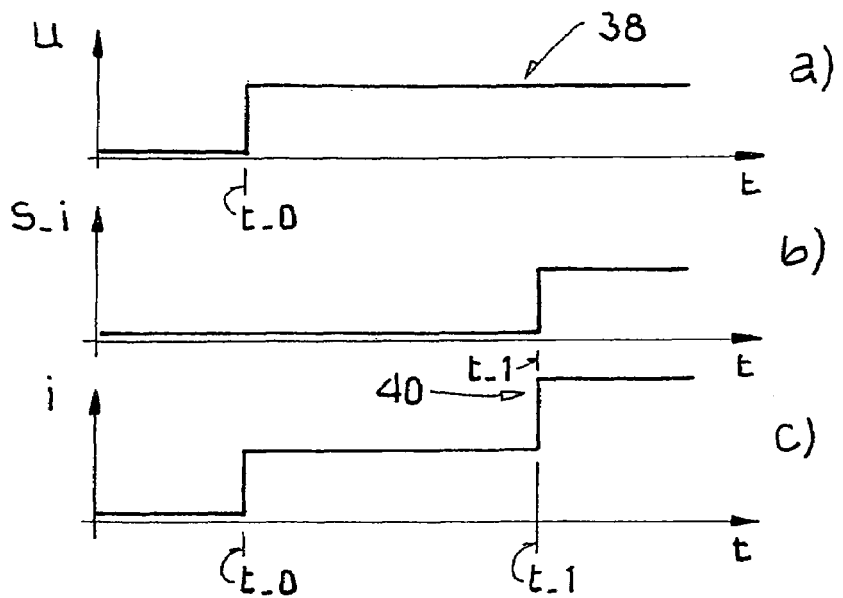
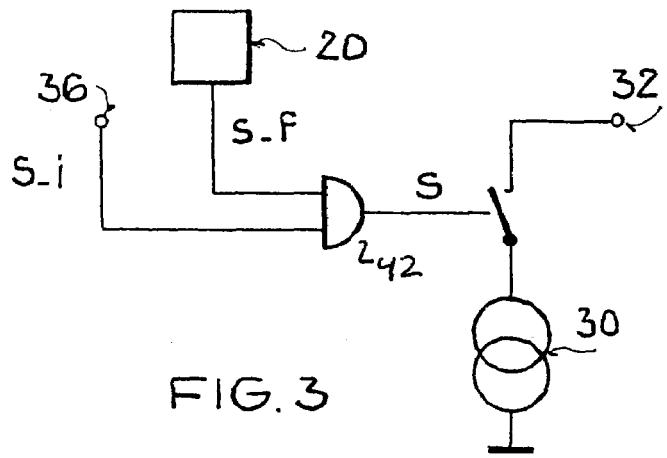
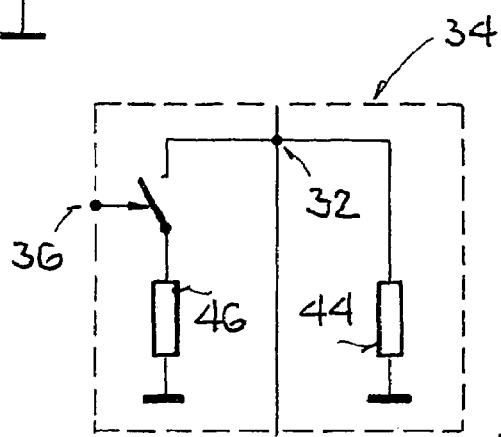
FIG. 2
FIG. 3
FIG. 4

INTEGRATED CIRCUIT WITH INTEGRATED CIRCUIT SECTION TO AID IN TESTING

This nonprovisional application claims priority under 35 U.S.C. § 119(a) on German Patent Application No. DE 102005052269, which was filed in Germany on Oct. 27, 2005, and which is herein incorporated by reference.

BACKGROUND OF THE INVENTION

1. Field of the Invention

The present invention relates to an integrated circuit having at least one digital input and having a first circuit section that has a current-voltage characteristic and that in the absence of an input signal holds a voltage at the input at a defined value, and having a second circuit section that provides a signal that is internal to the circuit and whose state does not directly show itself at an output of the circuit. The invention further relates to a method for testing such an integrated circuit.

2. Description of the Background Art

In this regard, a digital input is understood to be an input with a threshold switch that does not forward an input signal to an internal signal processing unit until the input signal exceeds a predefined threshold. When no input signal is provided to the input, electromagnetic influences can in principle cause voltage variations at the input that exceed the threshold, this, however, is undesirable. The aforementioned circuit section serves to avoid the undesirable states. For example, the circuit section has a current sink that is able to draw a current with a predefined maximum value from the input. The threshold cannot be exceeded until a current flowing into the input is greater than the current of the current sink. Such a current sink, also known as a pull-down current source, holds the voltage at the input to a value below the threshold. In an analogous manner, a pull-up current source holds the voltage above the threshold.

In the operation of integrated circuits, changes occur in the states of internal signals that are not directly reflected in the behavior of the input signals and output signals of the integrated circuit. The question of whether and, if applicable, at what point in time such a state change occurs can be important for functional testing at the end of a manufacturing process. In principle, an internal signal can be provided with its own terminal at which the internal signal can be tapped for test purposes. For a given circuit, however, the number of possible terminals is already limited by considerations of space. Moreover, each terminal constitutes an undesirable input for interfering influences such as ESD pulses.

Another option for evaluating an internal signal resides in the analysis of the input/output signal behavior of the integrated circuit. However, it is problematic in this regard that internal signals may under some circumstances only be reflected in a regular output signal very indirectly and with a long time delay, so that internal signals can only be detected incompletely or with a large expenditure of time in measurement, which can result in a reduced production rate, in particular in the case of final testing on a production line.

A circuit and a method are known from DE 100 64 478 A1, which corresponds to U.S. Pat. No. 6,937,048, which is incorporated herein by reference. This document addresses the problem that measurement pad areas within the circuit, and additional pins that are needed for external measurement of signals, occupy a substantial portion of the total circuit area, particularly for highly integrated circuits. Due to the large fraction of the overall chip area, the resulting fraction of the total cost of a circuit is substantial, which has an adverse economic impact. To remedy this, it is proposed therein for the signals generated by a circuit unit within an integrated circuit which are not measurable at the outputs in normal operation to be switched to the existing signal outputs as test signals for functional testing. To this end, while the supply voltage is present, a specific voltage is applied to at least one signal output of the integrated circuit, thus switching the integrated circuit into a test mode.

However, in the conventional art, when an internal test signal is switched to an output, the regular output signal cannot be obtained at the same time. Tests in which the internal signal and the regular output signal are required can thus only be performed one after the other, increasing the test time.

SUMMARY OF THE INVENTION

It is therefore an object of the present invention to provide an integrated circuit that permits testing of the states of internal signals without additional terminals and with a reduced expenditure of time in measurement.

A first circuit section is provided that has a control input for a control signal and is designed to change its current-voltage characteristic when the control signal is present at the control input. In addition, an electrical test signal can be applied to the at least one input and a time behavior of the current-voltage characteristic is evaluated for diagnosis.

The circuit section is coupled to an input which is present in any case. Its current-voltage characteristic is thus in principle detectable through the input. By changing the current-voltage characteristic as a function of the internal signal, the change of state of the internal signal can be reflected in a signal behavior at the input and can be read out without additional terminals.

The signal internal to the circuit can be the control signal. This is especially simple to implement in circuitry. Accordingly, the corresponding method is simple to carry out.

The control signal can be the result of an AND combination of an enable signal with the signal internal to the circuit. As a result of such an enable signal, it is possible to determine when the change in the current-voltage characteristic is permitted. This is helpful when the change could affect normal operation.

Another embodiment provides that the digital input can have a first pull-down current source that draws a first current from an input of a threshold switch, and for the circuit section to have a switchable pull-down current source that is switched by the signal internal to the circuit and draws a second current from the input of the threshold switch.

Alternatively, the digital input can have a first pull-up current source that supplies a first current to an input of a threshold switch, and the circuit section can have a switchable pull-up current source that is switched by the signal internal to the circuit and supplies a second current to the input of the threshold switch.

Additional alternatives provide for the digital input to have a first pull-down resistor (pull-up resistor) that is located between an input of a threshold switch and a first (second) reference voltage, and for the circuit section to have a switchable pull-down resistor (pull-up resistor) that is switched by the signal internal to the circuit and is located between the input of the threshold switch and the first (second) reference voltage.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 2 shows a timing diagram of signals from the embodiment illustrated in FIG. 1;

FIG. 3 illustrates an embodiment of the circuit which works with an enable signal; and FIG. 4 illustrates an embodiment of a first circuit section with pull-down resistors.

DETAILED DESCRIPTION

Figure 1:
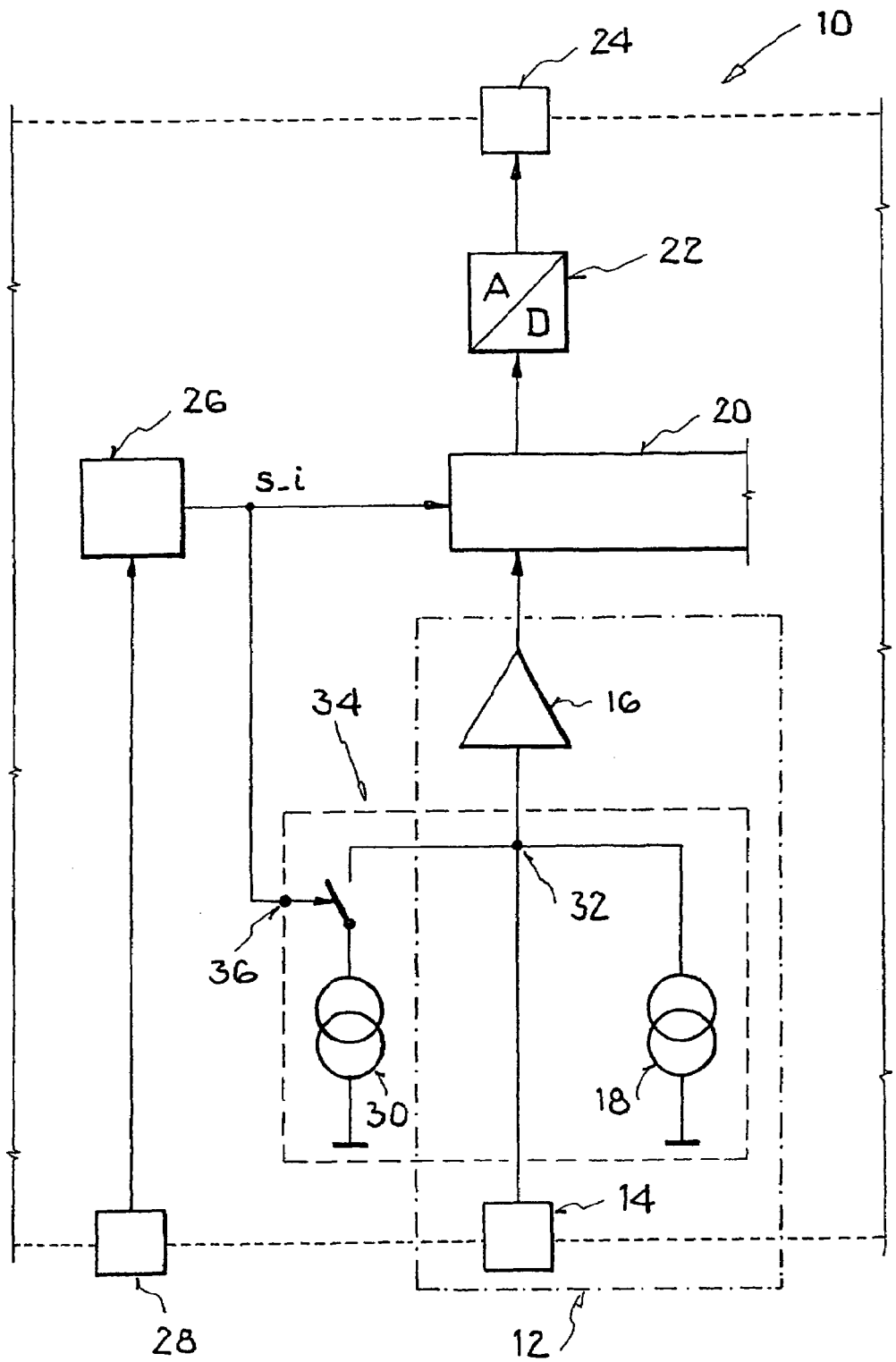
FIG. 1 illustrates an integrated circuit according to an embodiment of the invention.

FIG. 1 shows a portion of an integrated circuit 10, with a digital input 12. Of course, in general the integrated circuit 10 has additional digital inputs. The digital input 12 has an input pad 14 through which signals are fed into the integrated circuit 10, a threshold switch 16, and a pull-down current source 18. The threshold switch 16 is generally implemented as a Schmitt trigger. Input signals present at the input pad 14 that exceed the threshold of the threshold switch 16 are transmitted to a digital section 20 of the integrated circuit 10. The digital section 20 processes the input signals into one or more digital output signals while taking into account other signals. Such a digital output signal can be converted into an analog signal by means of the analog-to-digital converter 22, and can be transmitted to an output pad 24.

In the embodiment shown in FIG. 1, the digital output signal is formed while, in particular, taking into account the output signal of the threshold switch 16 and a signal S_i internal to the circuit that is output by an analog section 26. The analog section represents an example of a second circuit section. The signal S_i internal to the circuit is an example of a signal that arises in the interior of the integrated circuit 10, but is not directly obtainable at one of the input pads or output pads of the integrated circuit 10. In the embodiment shown in FIG. 1, the signal S_i internal to the circuit is, for example, then formed with a certain time delay when a predefined signal occurs at an analog input 28 of the integrated circuit 10. The integrated circuit 10 also has a switchable pull-down current source 30.

While the pull-down current source 18 continuously draws a first current from a node 32 of the digital input 12, a second current that the second pull-down current source 30 can draw is only drawn from the node 32 when the pull-down current source 30 is switched on. Taken together, the two pull-down current sources 18 and 30 connected together through the node 32 constitute a first circuit section 34 with a variable current-voltage characteristic that holds a voltage at the input 12, which is to say at the input pad 14 or node 32, at a defined value in the absence of an input signal.

If an input signal with a constant voltage u is applied to the input pad 14, the signal current from the input pad 14 to the node 32 changes as a function of whether the switchable current source 30 is switched on or off. In this regard, the first circuit section 34 possesses the aforementioned variable current-voltage characteristic. The first circuit section 34 has a control input 36 for a control signal with which the switchable pull-down current source 30 can be switched on. In the embodiment shown in FIG. 1, the aforementioned signal S_i internal to the circuit serves as the control signal for the first circuit section 34.

FIG. 2a shows a time behavior of a voltage signal 38 at the input pad 14, such as can be produced by connecting a constant voltage source to the input pad 14. At time t_0, the constant voltage source is switched on. Then a current i flows from the constant voltage source into the digital input 12 to the node 32. The current i exactly replaces the flows into the threshold switches 16 and pull-down current source 18. The switchable pull-down current source 30 is initially switched off here because no control signal is yet present at the control input 36 of the first circuit section 34. The current i then assumes a constant value, for example, such as is qualitatively represented in FIG. 2c between the times t_0 and t_1.

Then, at time t_1, the signal S_i internal to the circuit appears within the integrated circuit 10. In the embodiment from FIG. 1, the signal S_i is output by the analog section 26. However, the signal S_i can also be a signal that is formed within the digital section 20 of the integrated circuit 10. As an internal signal, this signal S_i does not appear at inputs or outputs of the integrated circuit 10, so it cannot be detected directly. In order to make detection possible nevertheless, the internal signal S_i is used in the embodiment from FIG. 1 to switch on the switchable pull-down current source 30 by the control input 36 of the first circuit section 34. Consequently, the switchable pull-down current source 30 is switched on at time t_1 when the signal S_i internal to the circuit occurs. The occurrence of the internal signal S_i within the circuit at time t_1 is shown in FIG. 2c.

The switching on of the switchable pull-down current source 30 causes the voltage characteristic of the first circuit section 34 to change. The switchable pull-down current source 30 draws an additional current from the node 32 of the digital input 12. The constant voltage source connected to the input pad 14 (has to) provide this additional current flowing out of the node 32 in order to keep the voltage at the input pad 14 constant. The constant voltage source must therefore supply a higher current starting at the time t_1 than in the period between t_0 and t_1. This higher current flow through the input pad 14 is measurable and is qualitatively represented in FIG. 2c through the step increase 40 at the time t_1. The occurrence of the step in the current signal i thus indicates the occurrence of the signal S_i internal to the integrated circuit.

The first circuit section 34 can thus also be viewed as a circuit section to aid in testing. The variation of the input current resulting from switching on of the switchable pull-down current source 30 is not normally problematic as long as the specified values for the circuit are maintained. In an embodiment from FIG. 1, sections of which are shown in FIG. 3, the variation of the input current can additionally be influenced by an enable signal S_f. In the embodiment from FIG. 3, a control signal S that switches on the switchable pull-down current source 30 is only output when the signal S_i from the analog section 26 that is present at the control input 36 and the enable signal S_f that, e.g., is output from the digital section 20, are present at the same time. In FIG. 3, this is represented by the AND combination 42.

It is a matter of course that the first circuit section 34 can also have pull-up current sources in place of pull-down current sources 18 and 30. Another alternative is shown in FIG. 4. FIG. 4 shows an alternative first circuit section 34 with a pull-down resistor 44, which replaces the current source 18 from FIG. 1. In this case, the switchable pull-down current source 30 from FIG. 1 is replaced by a switchable pull-down resistor 46, as is also shown in FIG. 4. The pull-down resistors 44, 46 can also be replaced by pull-up resistors.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An integrated circuit comprising:
at least one digital input which has a first circuit section that has a current voltage characteristic and that in the absence of an input signal to the digital input holds a voltage at the digital input at a defined value; and
a second circuit section that provides an internal signal that is internal to the integrated circuit and whose state is not directly provided at an output of the integrated circuit,
wherein the first circuit section has a control input for a control signal and changes the current-voltage characteristic when the control signal is present at the control input.

2. The circuit according to claim 1, wherein the internal signal is the control signal.

3. The circuit according to claim 1, wherein the control signal is the result of an AND combination of an enable signal with the internal signal to the circuit.

4. The circuit according to claim 1, wherein the digital input has a first pull-down current source that draws a first current from an input of a threshold switch, and wherein the first circuit section has a switchable pull-down current source that is switched by the signal internal to the circuit and draws a second current from the input of the threshold switch.

5. The circuit according to claim 1, wherein the digital input has a first pull-up current source that supplies a first current to an input of a threshold switch, and wherein the first circuit section has a switchable pull-up current source that is switched by the internal signal and supplies a second current to the input of the threshold switch.

6. The circuit according to claim 1, wherein the digital input has a first pull-down resistor that is provided between an input of a threshold switch and a first reference voltage, and wherein the circuit section has a switchable pull-down resistor that is switched by the internal signal and is located between the input of the threshold switch and the first reference voltage.

7. The circuit according to claim 1, wherein the digital input has a first pull-up resistor that is provided between an input of a threshold switch and a second reference voltage, and wherein the circuit section has a switchable pull-up resistor that is switched by the internal signal and is located between the input of the threshold switch and the second reference voltage.

* * * * *